United States Patent
Gui et al.

(10) Patent No.: US 11,009,578 B2
(45) Date of Patent: May 18, 2021

(54) SYSTEMS AND METHODS FOR PREDICTING $B_1^+$ MAPS FROM MAGNETIC RESONANCE CALIBRATION IMAGES

(71) Applicant: GE Precision Healthcare LLC, Milwaukee, WI (US)

(72) Inventors: Dawei Gui, Sussex, WI (US); Xiaoli Zhao, New Berlin, WI (US); Ling Sun, Brookfield, WI (US); Haonan Wang, Waukesha, WI (US); Wei Sun, Brookfield, WI (US)

(73) Assignee: GE PRECISION HEALTHCARE LLC, Milwaukee, WI (US)

( * ) Notice: Subject to any disclaimer, the term of this patent is extended or adjusted under 35 U.S.C. 154(b) by 134 days.

(21) Appl. No.: 16/514,906

(22) Filed: Jul. 17, 2019

(65) Prior Publication Data

US 2021/0018583 A1    Jan. 21, 2021

(51) Int. Cl.
*G06K 9/00* (2006.01)
*A61B 6/00* (2006.01)
(Continued)

(52) U.S. Cl.
CPC ..... *G01R 33/5659* (2013.01); *G01R 33/5608* (2013.01); *G01R 33/58* (2013.01);
(Continued)

(58) Field of Classification Search
USPC ....... 382/100, 103, 106, 128–134, 162, 168, 382/173, 181, 189, 191, 224, 254, 274,
(Continued)

(56) References Cited

U.S. PATENT DOCUMENTS 10,054,658 B2 * 8/2018 Gui ...................... G01R 33/246
10,775,469 B2 * 9/2020 Tsuruyama ........ G01R 33/5608
(Continued)

OTHER PUBLICATIONS

Magnetic Field MappingDepartment of Chemistry, Rochester Institute of Technology, Rochester, New York 14623; and Departments of ?Radiology and $Biophysics, University of Rochester Joseph P. Hornak,* Jerzy Szumowski,T and Robert G. Bryant (Sep. 11, 1987) (Year: 1987).*
(Continued)

*Primary Examiner* — Seyed H Azarian
(74) *Attorney, Agent, or Firm* — McCoy Russell LLP (57) ABSTRACT

Methods and systems are provided for predicting $B_1^+$ field maps from magnetic resonance calibration images using deep neural networks. In an exemplary embodiment a method for magnetic resonance imaging comprises, acquiring a magnetic resonance (MR) calibration image of an anatomical region, mapping the MR calibration image to a transmit field map ($B_1^+$ field map) with a trained deep neural network, acquiring a diagnostic MR image of the anatomical region, and correcting inhomogeneities of a transmit field in the diagnostic MR image with the $B_1^+$ field map. Further, methods and systems are provided for collecting and processing training data, as well as utilizing the training data to train a deep learning network to predict $B_1^+$ field maps from MR calibration images.

14 Claims, 7 Drawing Sheets

(51) Int. Cl.
*G01R 33/565* (2006.01)
*G06T 5/00* (2006.01)
*G06T 7/194* (2017.01)
*G01R 33/56* (2006.01)
*G06N 3/08* (2006.01)
*G01R 33/58* (2006.01)

(52) U.S. Cl.
CPC .............. *G06N 3/08* (2013.01); *G06T 5/002* (2013.01); *G06T 5/008* (2013.01); *G06T 7/194* (2017.01); *G06T 2207/10088* (2013.01); *G06T 2207/20081* (2013.01); *G06T 2207/20084* (2013.01); *G06T 2207/30004* (2013.01)

(58) Field of Classification Search
USPC ............... 382/276, 286, 291, 305; 378/21, 4
See application file for complete search history.

(56) References Cited

U.S. PATENT DOCUMENTS

2008/0100292 A1* 5/2008 Hancu ................. G01R 33/246
324/307
2019/0324106 A1* 10/2019 Tsuruyama ........ G01R 33/5608
2020/0011953 A1* 1/2020 Tomi-Tricot ......... G06K 9/6277
2020/0142057 A1* 5/2020 Pendse ............. G01R 33/56341

OTHER PUBLICATIONS

Van Den Bergen, B. et al., "Ultra fast electromagnetic field computations for RF multi-transmit techniques in high field MRI," Physics in Medicine and Biology, vol. 54, No. 5, Mar. 7, 2009, Available Online Jan. 30, 2009, 12 pages.

Sacolick, L. et al., "B1 Mapping by Bloch-Siegert Shift," Magnetic Resonance in Medicine, vol. 63, No. 5, May 1, 2010, 19 pages.

Sbrizzi, A. et al., "Robust Reconstruction of B1+ Maps by Projection into a Spherical Functions Space," Magnetic Resonance in Medicine, vol. 71, No. 1, Jan. 2014, Available Online Feb. 13, 2013, 8 pages.

Ronneberger, O. et al., "U-Net: Convolutional Networks for Biomedical Image Segmentation," Proceedings of the 18th International Conference on Medical Image Computing and Computer-Assisted Intervention, Oct. 5, 2015, Munich, Germany, 8 pages.

* cited by examiner

SYSTEMS AND METHODS FOR PREDICTING $B_1^+$ MAPS FROM MAGNETIC RESONANCE CALIBRATION IMAGES

TECHNICAL FIELD

Embodiments of the subject matter disclosed herein relate to magnetic resonance imaging (MRI), and more particularly, to systems and methods for predicting $B_1^+$ field maps from magnetic resonance (MR) calibration images using deep neural networks.

BACKGROUND

In MRI, the transmit radiofrequency field ($B_1^+$ field, herein also referred to as the transmit field) depends on the main magnetic field of the MRI system, transmit coil design, subject body shape and electromagnetic properties of the body. Thus, the $B_1^+$ field may vary spatially within an imaged anatomical region (that is, the $B_1^+$ field may contain spatial inhomogeneities) depending on the specific tissue/anatomical region being imaged, even after accounting for the main magnetic field of the MRI system and the transmit coil design. $B_1^+$ field inhomogeneities may cause challenges in MRI. For example, $B_1^+$ field inhomogeneities may lead to MR image quality degradation such as low signal-to-noise-ratio (SNR) and image shading.

In the past few years, various methods have been developed to obtain accurate measurements of the $B_1^+$ field, in order to account for $B_1^+$ field inhomogeneities. One approach for measuring the $B_1^+$ field uses a double angle gradient echo sequence; however, the acquisition time is very long for a 3D volume. Another approach uses the Bloch-Siegert shift based method; however, the acquisition time is also very long for a 3D volume (3-5 minutes). Yet another approach uses a dubbed dual refocusing echo acquisition mode (DREAM) $B_1$ sequence, but the measured $B_1^+$ field is not accurate depending on the tissue T1/T2/T2* properties. Thus, exploring techniques for rapidly and accurately determining a $B_1^+$ field is generally desired.

SUMMARY

The present disclosure at least partially addresses the issues described above. In one embodiment, a method for magnetic resonance imaging comprises acquiring a magnetic resonance (MR) calibration image of an anatomical region, mapping the MR calibration image to a transmit field map ($B_1^+$ field map) with a trained deep neural network, acquiring a diagnostic MR image of the anatomical region, and correcting inhomogeneities of the transmit field in the diagnostic MR image with the $B_1^+$ field map. In this way, a $B_1^+$ map may be rapidly and accurately predicted using an MR calibration image and a diagnostic image may be produced with a reduction in transmit field inhomogeneities.

The above advantages and other advantages, and features of the present description will be readily apparent from the following Detailed Description when taken alone or in connection with the accompanying drawings. It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Various aspects of this disclosure may be better understood upon reading the following detailed description and upon reference to the drawings in which.

The drawings illustrate specific aspects of the described systems and methods for predicting $B_1^+$ field maps from MR calibration images, using deep neural networks. Together with the following description, the drawings demonstrate and explain the structures, methods, and principles described herein. In the drawings, the size of components may be exaggerated or otherwise modified for clarity. Well-known structures, materials, or operations are not shown or described in detail to avoid obscuring aspects of the described components, systems and methods.

DETAILED DESCRIPTION

Figure 7:
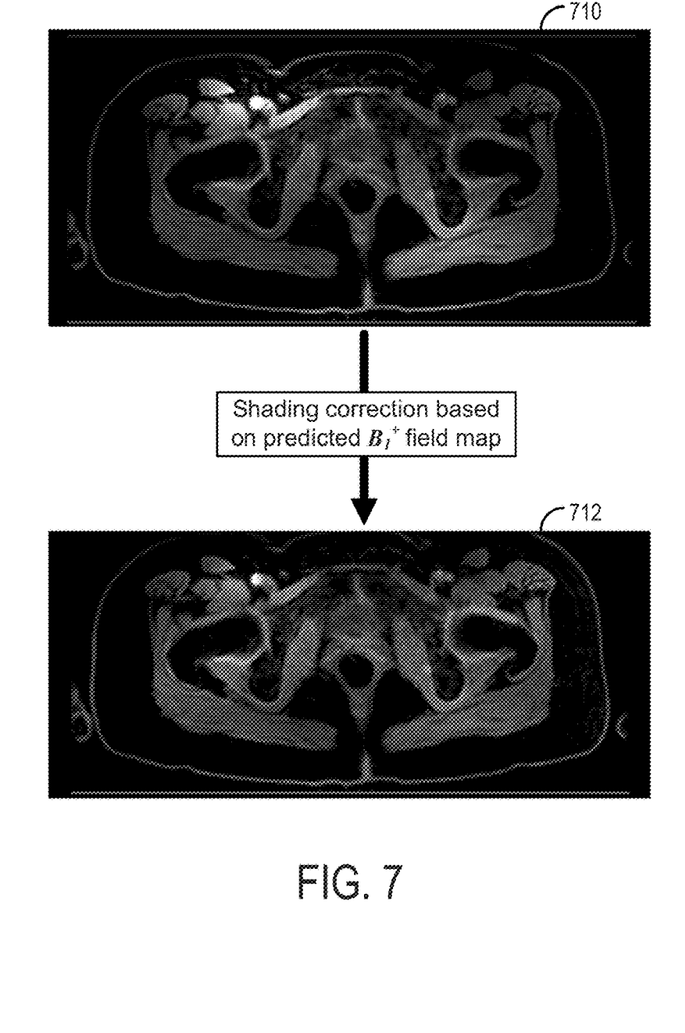
FIG. 7 shows an MR image of an abdominal cross section with shading correction using a predicted $B_1^+$ map.
Figure 8:
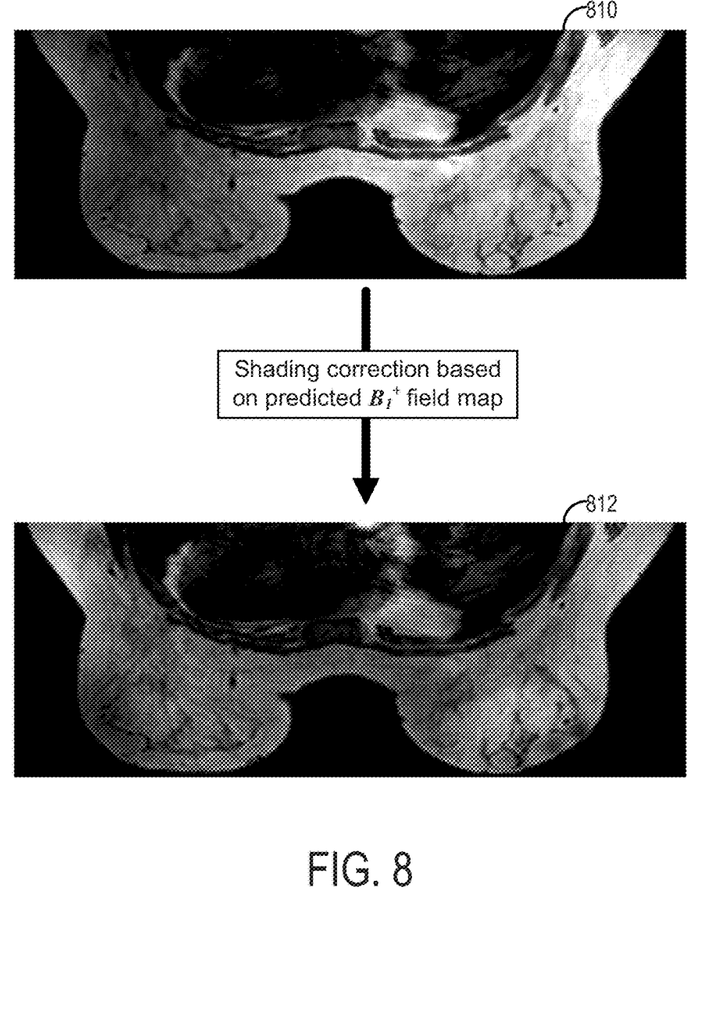
FIG. 8 shows an MR image of a breast cross section with shading correction using a predicted $B_1^+$ field map.

The following description relates to various embodiments for predicting $B_1^+$ field maps from MR calibration images, bypassing the need to measure the $B_1^+$ field using time intensive and/or inconsistent, conventional approaches. In some embodiments, an MR calibration image acquired by an MRI system (such as the MRI system of FIG. 1) may be processed by an image processing system, such as the image processing system shown in FIG. 2. The image processing system may comprise a deep neural network stored in non-transitory memory, such as the deep neural network illustrated schematically in FIG. 3. The image processing system and the MRI system may execute a method for magnetic resonance imaging with the $B_1^+$ field map obtained from the MR calibration image, such as the method illustrated in FIG. 4. The deep neural network may be trained using, for example, a method illustrated in FIG. 5, which uses measured $B_1^+$ field maps and corresponding MR calibration images, wherein the measured $B_1^+$ field maps may be processed according to one or more of the operations of the method shown in FIG. 6. The $B_1^+$ field maps predicted according to embodiments of the current disclosure may be used to process diagnostic MR images, such as performing the shading correction. FIG. 7 and FIG. 8 show shading correction using predicted $B_1^+$ field maps in diagnostic MR images of abdomen and breast, respectively.

The $B_1^+$ field depends on the main magnet field, transmit coil design, subject body shape and electromagnetic properties of the body. The subject body contours play a pivotal role in determining the transmit field inhomogeneity. Thus, a proton density weighted MRI volume (e.g., which may be generated from an MR calibration image), which contains the body contour information, the body transmit field, and receive field information, may be used to estimate the transmit field. It should be appreciated that other contrasts can be used as well. For example, a T 1/T2 mixed contrast may be acquired during a calibration scan and used to predict the $B_1^+$ field, without departing from the scope of the disclosure.

MR calibration images are routinely acquired during MR calibration scans for use in selecting surface coil elements, measuring surface coil sensitivities to correct signal shadings, and/or accelerate data acquisition, prior to diagnostic imaging of patient anatomical regions. The current disclosure enables additional use to be made of calibration images, by accurately predicting $B_1^+$ field maps from the calibration images, which enables more rapid determination of $B_1^+$ field maps with fewer MR scans, as well as enabling more precise control of transmitter gain. In some embodiments, the calibration scan is part of the pre-scan which may include quick higher-order shimming, coil tuning/matching, center frequency calibration, transmitter gain adjustment, receiver gain adjustment, and dummy cycle stimulation.

In some embodiments, an MR calibration image may be mapped to the corresponding $B_1^+$ field map with a trained deep neural network. The deep neural network may be trained by using training data pairs, each pair including an MR calibration image and a corresponding measured $B_1^+$ map as ground truth reference. In order to increase the robustness of the deep neural network, training data may comprise MR calibration images and $B_1^+$ field maps measured at multiple anatomies to provide a wide variety of different body shapes in the training data set. For a measured $B_1^+$ field map used in training of the deep neural network, background noise therein may reduce training efficiency and model accuracy. Thus, the background noise may be suppressed in the measured $B_1^+$ field map by using a mask. The foreground of the measured $B_1^+$ map may also include noise, such as sharp, non-continuous variations in the measured $B_1^+$ field. By fitting a function (such as a polynomial function, a harmonic function, or other function) to the foreground of the measured $B_1^+$ field, discontinuities and roughness may be reduced, thus facilitating deep neural network training and enabling more accurate predictions of $B_1^+$ maps from MR calibration images.

Figure 1:
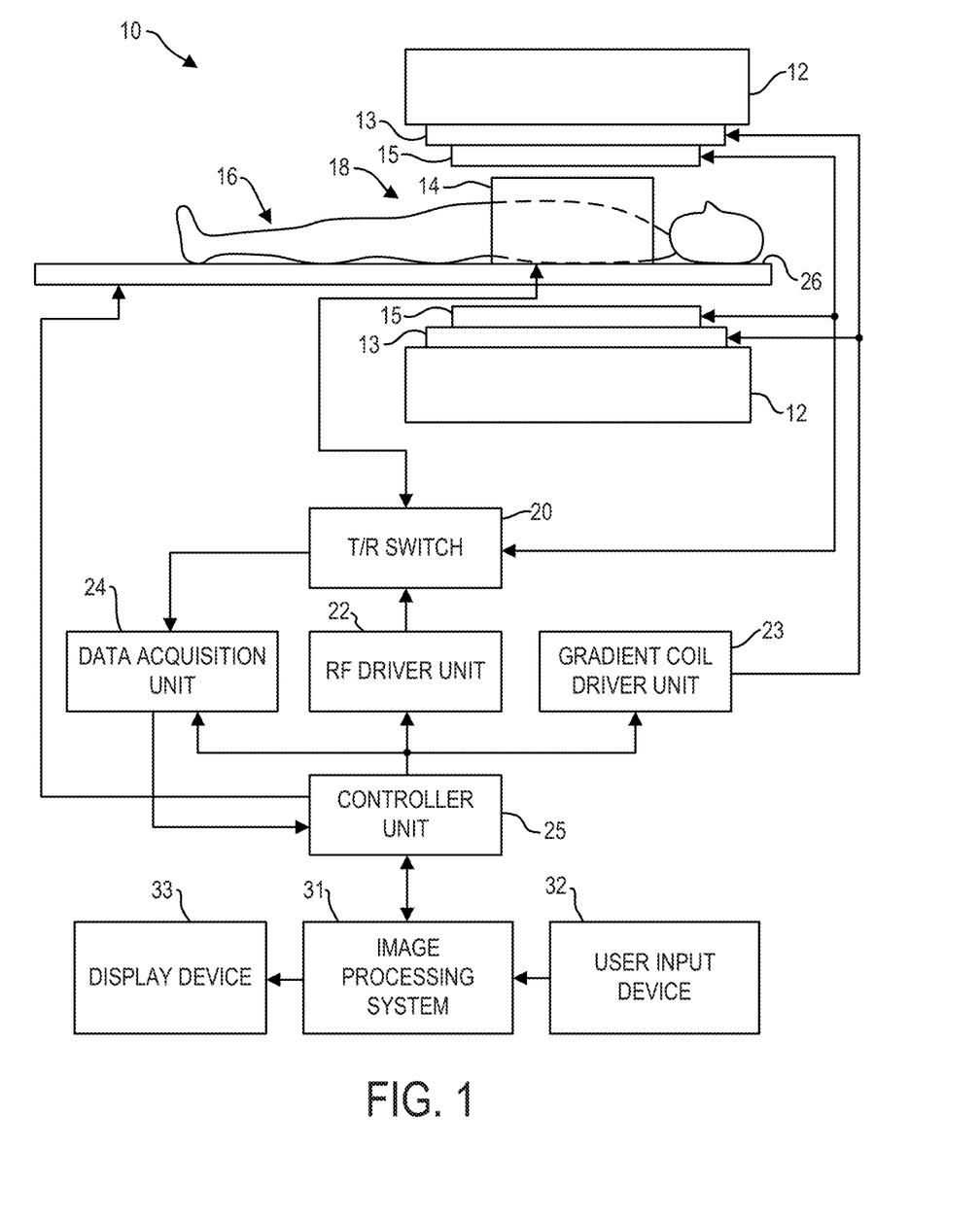
FIG. 1 shows a block diagram of an exemplary embodiment of an MRI system.

FIG. 1 illustrates an MRI system 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, an image processing system 31, a user input device 32, and a display device 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI system 10 transmits electromagnetic pulse signals to the subject 16 placed in an imaging space 18 with a static magnetic field formed to perform a scan for obtaining magnetic resonance signals from the subject 16. One or more MR images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI system 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field, $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

Differences in patient body contours and tissue specific properties may result in inhomogeneities of the $B_1$ field, which may result in intensity inhomogeneities (also referred to as shading) within a resultant MR image. Systems and methods are provided herein which may at least partially address shading in MR images resulting from $B_1$ field inhomogeneities.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI system 10 and replaced with another RF coil unit, the RF body coil unit 15 is fixedly attached and connected to the MRI system 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the image processing system 31.

The MRI system 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the system to carry out operations corresponding to pre-determined scanning. The recording medium may comprise, for example, a ROM, flexible disk, hard disk, optical disk, magneto-optical disk, CD-ROM, or non-transitory memory card. The controller unit 25 is connected to the user input device 32 and processes the operation signals input to the user input device 32 and furthermore controls the table 26, RF driver unit 22, gradient coil driver unit 23, and data acquisition unit 24 by outputting control signals to them. The controller unit 25 also controls, to obtain a desired image, the image processing system 31 and the display device 33 based on operation signals received from the user input device 32.

The user input device 32 includes user input devices such as a touchscreen, keyboard and a mouse. The user input device 32 is used by an operator, for example, to input such data as an imaging protocol and to set a region where an imaging sequence is to be executed. The data about the imaging protocol and the imaging sequence execution region are output to the controller unit 25.

The image processing system 31 includes a processor and non-transitory memory on which machine executable instructions may be stored, wherein the machine executable instructions may enable the processor to execute one or more of the steps of one or more of the methods herein disclosed. The image processing system 31 may be connected to the controller unit 25 and may perform data processing based on control signals received from the controller unit 25 or user input device 32. The image processing system 31 is also connected to the data acquisition unit 24 and generates spectrum data by applying various image processing operations to the magnetic resonance signals output from the data acquisition unit 24.

The image processing system 31 may predict $B_1^+$ field maps from MR calibration images acquired by MRI system 10. And MRI system 10 may utilize the $B_1^+$ field maps to adjust scan parameters (e.g., transmit gain) for acquiring diagnostic MR images, and/or the imaging processing system 31 may use the $B_1^+$ field maps to process diagnostic MR images. In one example, image processing system 31 and MRI system 10 may execute such a method, which will be discussed in detail below with reference to FIG. 4. Image processing system 31 may thereby produce $B_1^+$ field maps using rapidly acquired MR calibration images. In some embodiments, image processing system 31 may be further configured to process a diagnostic MR image of an anatomical region based on a predicted $B_1^+$ field map of the same anatomical region, such as by adjusting a pixel/voxel intensity based on the predicted $B_1^+$ field map to correct or at least partially mitigate shading caused by $B_1^+$ field inhomogeneities. Image processing system 31 may be further configured to display the $B_1^+$ field map, and/or the shading corrected MR images via display device 33.

The display device 33 displays an image on the display screen of the display device based on control signals received from the controller unit 25. The display device 33 displays, for example, a shading corrected MR image produced by the image processing system 31. Display device 33 may comprise a graphical user interface, wherein a user may interact with/input/alter one or more data fields via user input device 32. The display device 33 may display a two-dimensional (2D) slice image or three-dimensional (3D) image of the subject 16 generated by the image processing system 31.

During a scan, RF coil array interfacing cables (not shown in FIG. 1) may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil unit 14 receives the MR signals. More generally, RF coils are used to transmit RF excitation signals ("transmit coil"), and to receive the MR signals emitted by an imaging subject ("receive coil"). In some embodiments, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may comprise separate components.

Figure 2:
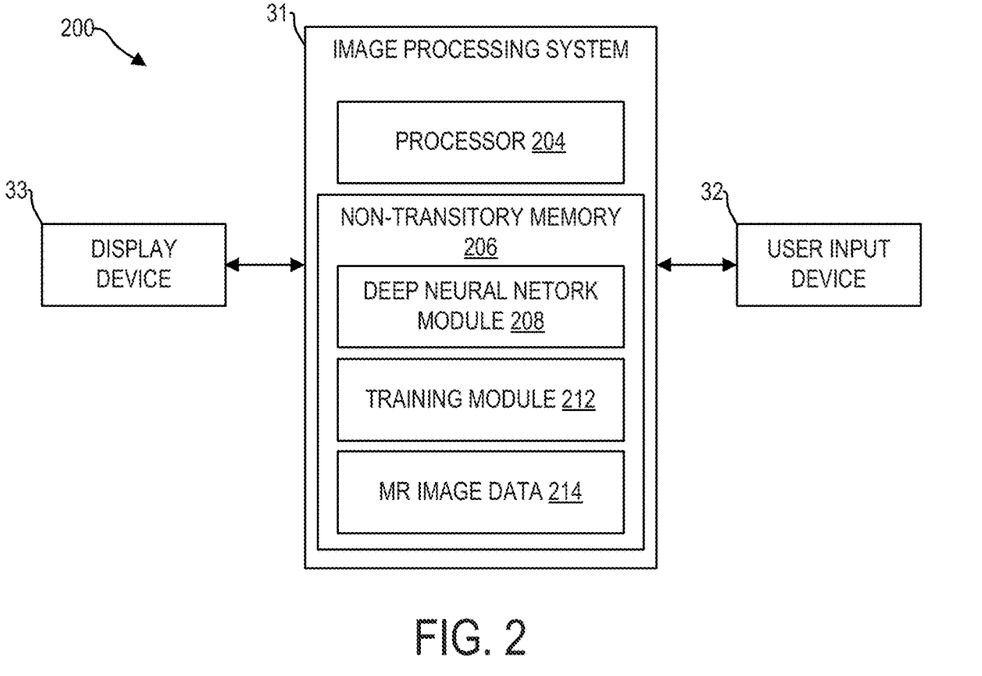
FIG. 2 is a schematic diagram illustrating a system for predicting a $B_1^+$ map from an MR calibration image, according to an exemplary embodiment.

Referring to FIG. 2, MR image processing system 200 is shown, in accordance with an exemplary embodiment. In some embodiments, MR image processing system 200 is incorporated into the MRI system. In some embodiments, at least a portion of MR image processing 200 is disposed at a device (e.g., edge device, server, etc.) communicably coupled to the MRI system via wired and/or wireless connections. In some embodiments, at least a portion of MR image processing system 200 is disposed at a separate device (e.g., a workstation) which can receive images from the MRI system or from a storage device which stores the images generated by the MRI system. MR image processing system 200 may comprise image processing system 31, user input device 32, and display device 33.

Image processing system 31 includes a processor 204 configured to execute machine readable instructions stored in non-transitory memory 206. Processor 204 may be single core or multi-core, and the programs executed thereon may be configured for parallel or distributed processing. In some embodiments, the processor 204 may optionally include individual components that are distributed throughout two or more devices, which may be remotely located and/or configured for coordinated processing. In some embodiments, one or more aspects of the processor 204 may be virtualized and executed by remotely-accessible networked computing devices configured in a cloud computing configuration.

Non-transitory memory 206 may store deep neural network module 208, training module 212, and MR image data 214. Deep neural network module 208 may include one or more deep neural networks, comprising a plurality of weights and biases, activation functions, loss functions, gradient descent algorithms, and instructions for implementing the one or more deep neural networks to receive MR calibration images and map the input MR calibration images to output, wherein the output may be used to predict a $B_1^+$ field map corresponding to the MR calibration image. For example, deep neural network module 208 may store instructions for implementing a neural network, such as the convolutional neural network (CNN) of CNN architecture 300, shown in FIG. 3. Deep neural network module 208 may include trained and/or untrained neural networks and may further include various data, such as training data, training routines, or parameters (e.g., weights and biases), associated with one or more neural network models stored therein.

Non-transitory memory 206 may further include training module 212, which comprises instructions for training one or more of the deep neural networks stored in deep neural network module 208. Training module 212 may include instructions that, when executed by processor 204, cause image processing system 31 to conduct one or more of the steps of method 500 and/or 600, discussed in more detail below. In one example, training module 212 includes instructions for receiving training data pairs from MR image data 214, which comprise pairs of MR calibration images and corresponding ground truth $B_1^+$ field maps, for use in training one or more of the deep neural networks stored in deep neural network module 208. In another example, training module 212 may include instructions for generating a ground truth $B_1^+$ field map from an unprocessed $B_1^+$ field in MR image data 214, according to one or more of the steps of method 600 shown in FIG. 6. In some embodiments, the training module 212 is not disposed at the image processing system 31. The deep neural network module 208 includes trained and validated network(s).

Non-transitory memory 206 may further store MR image data 214, such as MR images captured by the MRI system. For example, the MR image data 214 may include MR calibration images, measured $B_1^+$ field maps, background suppressed $B_1^+$ field maps, predicted $B_1^+$ field maps, shading corrected and un-shading corrected MR images, etc. In some embodiments, MR calibration images and corresponding ground truth $B_1^+$ field maps may be stored in an ordered format, such that each MR calibration image of an anatomical region of a subject is associated with a ground truth $B_1^+$ field map of the same anatomical region of the same subject.

In some embodiments, the non-transitory memory 206 may include components disposed at two or more devices, which may be remotely located and/or configured for coordinated processing. In some embodiments, one or more aspects of the non-transitory memory 206 may include remotely-accessible networked storage devices configured in a cloud computing configuration.

Image processing system 200 may further include user input device 32. User input device 32 may comprise one or more of a touchscreen, a keyboard, a mouse, a trackpad, a motion sensing camera, or other device configured to enable a user to interact with and manipulate data within image processing system 31. In one example, user input device 32 may enable a user to make a selection of a MR calibration image to use in prediction of a $B_1^+$ field map.

Display device 33 may include one or more display devices utilizing virtually any type of technology. In some embodiments, display device 33 may comprise a computer monitor, and may display unprocessed and processed MR images and/or parametric maps. Display device 33 may be combined with processor 204, non-transitory memory 206, and/or user input device 32 in a shared enclosure, or may be peripheral display devices and may comprise a monitor, touchscreen, projector, or other display device known in the art, which may enable a user to view MR images produced by an MRI system, and/or interact with various data stored in non-transitory memory 206.

It should be understood that image processing system 200 shown in FIG. 2 is for illustration, not for limitation. Another appropriate image processing system may include more, fewer, or different components.

Figure 3:
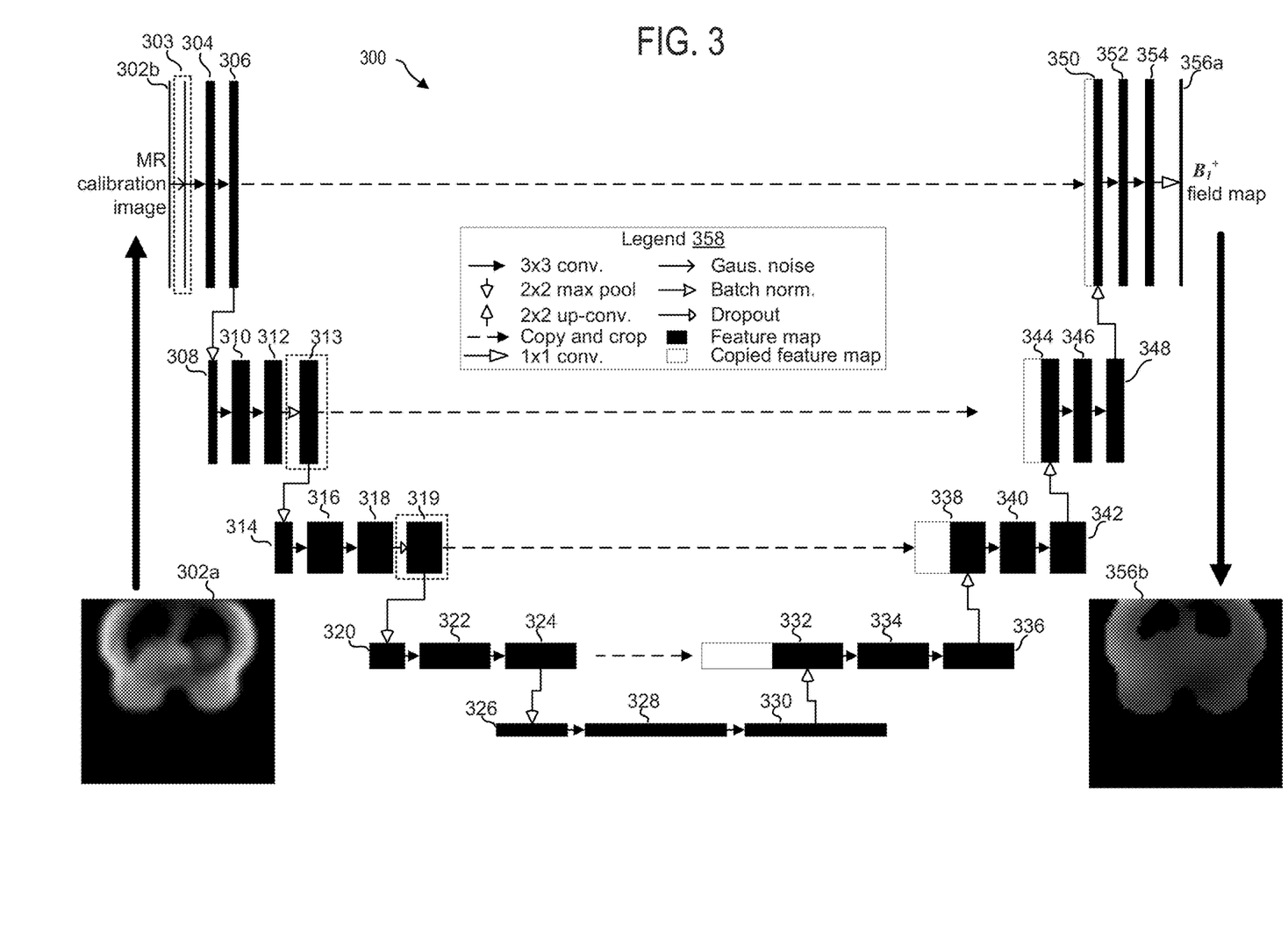
FIG. 3 is a schematic diagram illustrating the layout of a deep learning network which can be used in the system of FIG. 2, according to an exemplary embodiment.

Turning to FIG. 3, CNN architecture 300 for predicting $B_1^+$ field maps from MR calibration images is shown, in accordance with an exemplary embodiment. CNN architecture 300 represents a U-net architecture, which may be divided into an autoencoder portion (descending portion, elements 302b-330) and an autodecoder portion (ascending portion, elements 332-356a). CNN architecture 300 is configured to receive an MR calibration image of an anatomical region, comprising a plurality of pixels/voxels, and map the input MR calibration image to a $B_1^+$ field map of the same anatomical region. CNN architecture 300 includes a series of mappings, from an input image tile 302b which may be received by an input layer, through a plurality of feature maps, and finally to an output $B_1^+$ field map 356b, which may be produced by an output layer 356a.

The various elements comprising CNN architecture 300 are labeled in legend 358. As indicated by legend 358, CNN architecture 300 includes a plurality of feature maps (and/or copied feature maps), wherein each feature map may receive input from either an external file, or a previous feature map, and may transform/map the received input to output to produce a next feature map. Each feature map may comprise a plurality of neurons, where in some embodiments, each neuron may receive input from a subset of neurons of a previous layer/feature map, and may compute a single output based on the received inputs, wherein the output may be propagated to a subset of the neurons in a next layer/feature map. A feature map may be described using spatial dimensions, such as length, width, and depth, wherein the dimensions refer to the number of neurons comprising the feature map (e.g., how many neurons long, how many neurons wide, and how many neurons deep, a specified feature map is).

In some embodiments, the neurons of the feature maps may compute an output by performing a dot product of received inputs using a set of learned weights (each set of learned weights may herein be referred to as a filter), wherein each received input has a unique corresponding learned weight, wherein the learned weight was learned during training of the CNN.

The transformations/mappings performed by each feature map are indicated by arrows, wherein each type of arrow corresponds to a distinct transformation, as indicated by legend 358. Rightward pointing solid black arrows indicate 3×3 convolutions with stride of one, wherein output from a 3×3 grid of feature channels of an immediately preceding feature map are mapped to a single feature channel of a current feature map. Each 3×3 convolution may be followed by an activation function, wherein, in one embodiment, the activation function comprises a rectified linear unit (ReLU).

Downward pointing hollow arrows indicate 2×2 max pooling, wherein the max value from a 2×2 grid of feature channels is propagated from an immediately preceding feature map to a single feature channel of a current feature map, thereby resulting in a 4-fold reduction in spatial resolution of the immediately preceding feature map.

Upward pointing hollow arrows indicate 2×2 up-convolutions, which comprise mapping output from a single feature channel of an immediately preceding feature map to a 2×2 grid of feature channels in a current feature map, thereby increasing the spatial resolution of the immediately preceding feature map 4-fold.

Rightward pointing dash-tailed arrows indicate copying and cropping of a feature map for concatenation with another, later occurring, feature map. Cropping enables the dimensions of the copied feature map to match the dimensions of the feature map with which the copied feature map is to be concatenated. It will be appreciated that when the size of the first feature map being copied and the size of the second feature map to be concatenated with the first feature map, are equal, no cropping may be performed.

Rightward pointing arrows with hollow elongated triangular heads indicate a 1×1 convolution, in which each feature channel in an immediately preceding feature map is mapped to a single feature channel of a current feature map, or in other words, wherein a 1-to-1 mapping of feature channels between an immediately preceding feature map and a current feature map occurs.

Rightward pointing arrows with chevron heads indicate incorporation of Gaussian noise into a received input feature map.

Rightward pointing arrows with arcuate hollow heads indicate batch normalization operations, wherein a distribution of activations of an input feature map are normalized.

Rightward pointing arrows with a short hollow triangular head indicates a dropout operation, wherein random or pseudo-random dropout of input neurons (as well as their inputs and outputs) occurs during training.

In addition to the operations indicated by the arrows within legend 358, CNN architecture 300 includes solid filled rectangles corresponding to feature maps, wherein feature maps comprise a height (top to bottom length as shown in FIG. 3, corresponds to a y spatial dimension in an x-y plane), width (not shown in FIG. 3, assumed equal in magnitude to height, corresponds to an x spatial dimension in an x-y plane), and depth (a left-right length as shown in FIG. 3, corresponds to the number of features within each feature channel). Likewise, CNN architecture 300 includes hollow (unfilled) rectangles, corresponding to copied and cropped feature maps, wherein copied feature maps comprise height (top to bottom length as shown in FIG. 3, corresponds to a y spatial dimension in an x-y plane), width (not shown in FIG. 3, assumed equal in magnitude to height, corresponds to an x spatial dimension in an x-y plane), and depth (a length from a left side to a right side as shown in FIG. 3, corresponds to the number of features within each feature channel).

Starting at input image tile 302b (herein also referred to as an input layer), data corresponding to an MR calibration image, such as that shown by MR calibration image 302a, may be input and mapped to a first set of features. In some embodiments, the input data is acquired during a calibration scan that is carried out with a proton density based gradient echo sequence. In some embodiments, the input data is pre-processed (e.g., normalized) before being processed by the neural network. In some embodiments, the input data is magnitude data.

As indicated by the rightward pointing chevron headed arrow immediately to the right of input image tile 302b, a Gaussian noise incorporation operation is optionally conducted on the output of the input image tile 302b. The Gaussian noise incorporation operation introduces additive, zero centered Gaussian noise during training to data output from input image tile 302b to feature map 303. Feature map 303 may comprise the same dimensions as the input with the same depth as input image tile 302b. By incorporating Gaussian noise in a random, or pseudo random manner into input image data, a probability of overfitting may be reduced during training of CNN 300.

As indicated by the solid black rightward pointing arrow immediately to the right of feature map 303, a 3×3 convolution of the feature channels of feature map 303 is performed to produce feature map 304. As discussed above, a 3×3 convolution includes mapping input from a 3×3 grid of feature channels to a single feature channel of a current feature map, using learned weights, wherein the learned weights are referred to as a convolution filter. Each 3×3 convolution in CNN architecture 300 may include a subsequent activation function, which in one embodiment includes passing the output of each 3×3 convolution through a ReLU. In some embodiments, activation functions other than ReLUs may be employed, such as Softplus (also referred to as SmoothReLUs), leaky ReLUs, noisy ReLUs, exponential linear units (ELUs), Tanh, Gaussian, Sinc, Bent identity, logistic functions, and other activation functions known in the art of machine learning.

As indicated by the solid black rightward pointing arrow immediately to the right of feature map 304, a 3×3 convolution is performed on feature map 304 to produce feature map 306.

As indicated by the downward pointing arrow beneath feature map 306, a 2×2 max pooling operation is performed on feature map 306 to produce feature map 308. Briefly, a 2×2 max pooling operation includes determining a max feature value from a 2×2 grid of feature channels of an immediately preceding feature map, and setting a single feature, in a single feature channel, of a current feature map, to the max value so determined. Additionally, feature map 306 is cropped, copied, and concatenated with output from feature map 348 to produce feature map 350, as indicated by the dash-tailed rightward pointing arrow immediately to the right of feature map 306.

As indicated by the solid black rightward pointing arrow immediately to the right of feature map 308, a 3×3 convolution with stride 1 is performed on feature map 308 to produce feature map 310.

As indicated by the solid black rightward pointing arrow immediately to the right of feature map 310, a 3×3 convolution with stride 1 is performed on feature map 310 to produce feature map 312.

As indicated by the rightward pointing hollow headed arcuate arrow immediately to the right of feature map 312, an optional batch normalization operation is conducted on the output of feature map 312 to produce feature map 313. In batch normalization, the outputs of feature map 312 are normalized across a mini-batch to speed up training of CNNs and reduce the sensitivity to network initialization. Batch normalization operations normalize the activations of each channel by subtracting the mini-batch mean and dividing by the mini-batch standard deviation. Then, the batch operation shifts the input by a learnable offset β and scales it by a learnable scale factor γ.

As indicated by the downward pointing hollow headed arrow beneath feature map 313, a 2×2 max pooling operation is performed on feature map 313 to produce feature map 314, wherein feature map 314 is of one fourth the spatial resolution of feature map 312. Additionally, feature map 313 is copied, cropped, and concatenated with output from feature map 342 to produce feature map 344, as indicated by the dash-tailed rightward pointing arrow immediately to the right of feature map 313.

As indicated by the solid black rightward pointing arrow immediately to the right of feature map 314, a 3×3 convolution with stride 1 is performed on feature map 314 to produce feature map 316.

As indicated by the solid black rightward pointing arrow immediately to the right of feature map 316, a 3×3 convolution with stride 1 is performed on feature map 316 to produce feature map 318.

As indicated by the rightward pointing short hollow headed triangular arrow immediately to the right of feature map 318, an optional dropout operation is performed during training, wherein a random or pseudo random subset of input activations/features are removed/deleted for a given iteration of training, thereby reducing a probability of CNN 300 overfitting the training data.

As indicated by the downward pointing arrow beneath feature map 319, a 2×2 max pooling operation is performed on feature map 319 to produce feature map 320, wherein feature map 320 is of half the spatial resolution of feature map 319. Additionally, feature map 319 is copied, cropped, and concatenated with output from feature map 336 to produce feature map 338, as indicated by the dash-tailed rightward pointing arrow immediately to the right of feature map 319.

As indicated by the solid black rightward pointing arrow immediately to the right of feature map 320, a 3×3 convolution with stride 1 is performed on feature map 320 to produce feature map 322.

As indicated by the solid black rightward pointing arrow immediately to the right of feature map 322, a 3×3 convolution with stride 1 is performed on feature map 322 to produce feature map 324.

As indicated by the downward pointing arrow beneath feature map 324, a 2×2 max pooling operation is performed on feature map 324 to produce feature map 326, wherein feature map 326 is of one fourth the spatial resolution of feature map 324. Additionally, feature map 324 is copied, cropped, and concatenated with output from feature map 330 to produce feature map 332, as indicated by the dash-tailed rightward pointing arrow immediately to the right of feature map 324.

As indicated by the solid black rightward pointing arrow immediately to the right of feature map 326, a 3×3 convolution is performed on feature map 326 to produce feature map 328.

As indicated by the solid black rightward pointing arrow immediately to the right of feature map 328, a 3×3 convolution with stride 1 is performed on feature map 328 to produce feature map 330.

As indicated by the upward pointing arrow immediately above feature map 330, a 2×2 up-convolution is performed on feature map 330 to produce a first half of feature map 332, while copied and cropped features from feature map 324 are used to produce a second half of feature map 332. Briefly, a 2×2 up-convolution (herein also referred to as a deconvolution, or up-sampling) with stride of 2, includes mapping a single feature in a single feature channel of an immediately preceding feature map to four features distributed amongst four feature channels in a current feature map (that is, output from a single feature channel is taken as input by four feature channels). Up-convolution/deconvolution/up-sampling comprises projecting a feature value, from a single feature channel, through a deconvolution filter (also herein referred to as a deconvolution kernel) to produce a plurality of outputs.

As indicated by the solid black rightward pointing arrow immediately to the right of feature map 332, a 3×3 convolution is performed on feature map 332 to produce feature map 334.

As indicated by the solid black rightward pointing arrow immediately to the right of feature map 334, a 3×3 convolution is performed on feature map 334 to produce feature map 336.

As indicated by the upward pointing arrow immediately above feature map 336, a 2×2 up convolution is performed on feature map 336 to produce half of feature map 338, while copied and cropped features from feature map 318 produce the second half of feature map 338.

As indicated by the solid black rightward pointing arrow immediately to the right of feature map 338, a 3×3 convolution is performed on feature map 338 to produce feature map 340.

As indicated by the solid black rightward pointing arrow immediately to the right of feature map 340, a 3×3 convolution is performed on feature map 340 to produce feature map 342.

As indicated by the upward pointing arrow immediately above feature map 342, a 2×2 up convolution is performed on feature map 342 to produce a first half of feature map 344, while copied and cropped features from feature map 312 are used to produce the second half of feature map 344.

As indicated by the solid black rightward pointing arrow immediately to the right of feature map 344, a 3×3 convolution is performed on feature map 344 to produce feature map 346.

As indicated by the solid black rightward pointing arrow immediately to the right of feature map 346, a 3×3 convolution is performed on feature map 346 to produce feature map 348.

As indicated by the upward pointing arrow immediately above feature map 348, a 2×2 up convolution is performed on feature map 348 to produce a first half of feature map 350, while copied and cropped features from feature map 306 are used to produce the second half of feature map 350.

As indicated by the solid black rightward pointing arrow immediately to the right of feature map 350, a 3×3 convolution is performed on feature map 350 to produce feature map 352.

As indicated by the solid black rightward pointing arrow immediately to the right of feature map 352, a 3×3 convolution is performed on feature map 352 to produce feature map 354.

As indicated by the hollow headed rightward pointing arrow immediately to the right of feature map 354, a 1×1 convolution is performed on feature map 354 to produce output layer 356a. Briefly, a 1×1 convolution includes a 1-to-1 mapping of feature channels in a first feature space to feature channels in a second feature space, wherein no reduction in spatial resolution occurs.

The one or more features per channel in output layer 356a may correspond to the predicted $B_1^+$ field intensity in a given region of the input MR calibration image (or a given input pixel of the MR calibration image). Output layer 356a may comprise an output layer of neurons, wherein each neuron may correspond to a pixel of a $B_1^+$ field map, and wherein output of each neuron may correspond to the predicted $B_1^+$ field strength/intensity in given location within the input MR calibration image.

In this way, CNN architecture 300 may enable mapping of an MR calibration image to a predicted $B_1^+$ field map. CNN architecture 300 illustrates the feature map transformations which occur as an input image tile is propagated through the neuron layers of the convolutional neural network, to produce predicted $B_1^+$ field map.

The weights (and biases) of the convolutional layers in the neural network 300 are learned during training, as will be discussed in more detail with reference to FIGS. 5 and 6 below. Briefly, a loss function is defined to reflect the difference between the predicted $B_1^+$ field map output by the neural network 300 and a corresponding ground truth $B_1^+$ field map, produced in some embodiments, according to method 600 below. The loss may be back projected to the neural network to update the weights (and biases) of the convolutional layers. A plurality of training data pairs, comprising MR calibration images and corresponding ground truth $B_1^+$ field maps, may be used to train the neural network 300.

It will be appreciated that the current disclosure encompasses neural network architectures comprising one or more regularization layers, including batch normalization layers, dropout layers, Gaussian noise layers, and other regularization layers known in the art of machine learning which may be used during training to mitigate overfitting and increase training efficiency while reducing training duration. Regularization layers are used during CNN training and deactivated or removed during post training implementation of the CNN. These layers may be interspersed between the layers/feature maps shown in FIG. 3, or may replace one or more of the shown layers/feature maps.

It should be understood that the architecture and configuration of CNN 300 shown in FIG. 3 is for illustration, not for limitation. Any appropriate neural network can be used herein for predicting $B_1^+$ field maps from MR calibration images, such as ResNet, recurrent neural networks, General Regression Neural Network (GRNN), etc. One or more specific embodiments of the present disclosure are described above in order to provide a thorough understanding. These described embodiments are only examples of systems and methods for predicting $B_1^+$ field maps from MR calibration images using a deep neural network. The skilled artisan will understand that specific details described in the embodiments can be modified when being placed into practice without deviating the spirit of the present disclosure.

Figure 4:
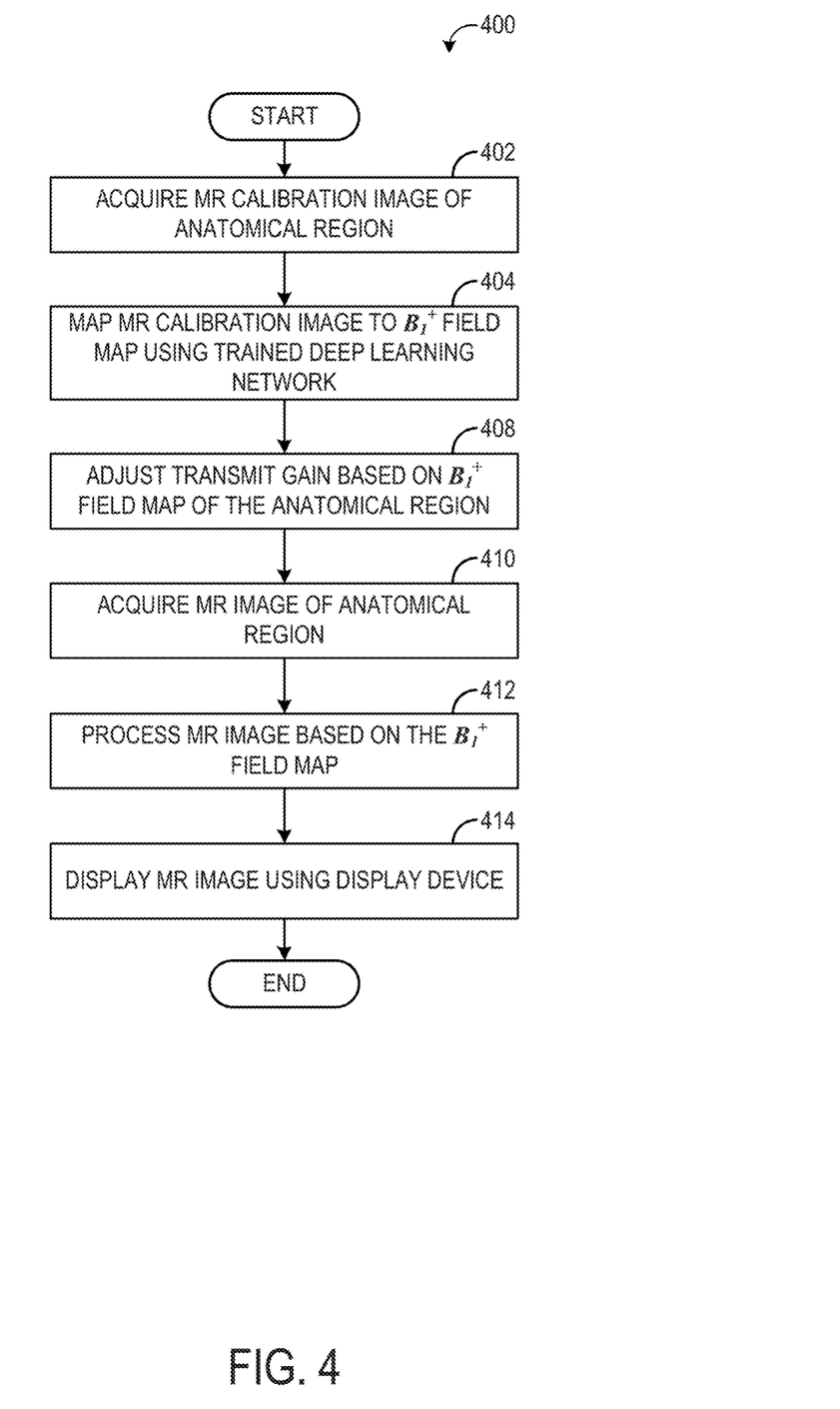
FIG. 4 is a flow chart illustrating a method for magnetic resonance imaging with $B_1^+$ maps obtained from MR calibration images, according to an exemplary embodiment.

Referring to FIG. 4, a flow chart of a method 400 for magnetic resonance imaging with a $B_1^+$ field map obtained from an MR calibration image is shown, according to an exemplary embodiment. Method 400 may be implemented by the system 10 shown in FIG. 1.

Method 400 begins at operation 402, where an MR calibration image of an anatomical region is acquired by an MRI system (e.g., MRI system 10 shown in FIG. 1). The MR calibration image may be acquired by using, for example, a fast spoiled gradient echo sequence. The anatomical region may be a knee, an abdomen, a brain, etc. MR calibration images may be acquired/captured in relatively short amounts of time, as compared to diagnostic images. For example, an MR calibration image may be captured in under 3 seconds, using a fast spoiled gradient echo sequence with TR/TE of 1.4 ms/0.4 ms, receive bandwidth of 62.5 KHz, resolution of 32×32×28 on a 48 cm×48 cm×42 cm imaging volume. By utilizing MR calibration images, the acquisition/capture of which may already be incorporated in a diagnostic imaging workflow, as the basis of $B_1^+$ field map prediction, method 400 may enable $B_1^+$ field map determination in less time, and with fewer scans, than current methods, which may use minutes and additional scans to determine a $B_1^+$ field map.

At operation 404, the MR calibration image is input into a trained deep neural network, which maps the calibration image to a $B_1^+$ field map. In some embodiments, the input MR calibration image is a magnitude image. In some embodiments, the deep neural network is a CNN, having an autoencoder-autodecoder type architecture, such as CNN 300 shown in FIG. 3. In some embodiments, each pixel/voxel value of the MR calibration image is input into a distinct node/neuron of the input layer of the deep neural network, and propagates through the one or more hidden layers, until reaching an output layer of the deep neural network. The relationship between two adjacent layers of the deep neural network, other than the input layer, may be described as follows:

$$Y_j = f\left(\sum_{i=1}^{n} W_{ji} X_i + B_j\right)$$

Where $X_i$ is the output of the i-th neuron of the preceding layer, $Y_j$ is the j-th neuron of the subsequent layer, $W_{ji}$ is the weight, and $B_j$ is the bias. In some embodiments, the activation function $f$ is a rectified linear unit (ReLU) function, for example, plain ReLU function, leaky ReLU function, parametric ReLU function, etc.

In some embodiments, the output from the output layer of the deep learning network is of the same dimension as the input MR calibration image. However, in some embodiments, the output may comprise a matrix of values with dimensions less than the dimensions of the input MR calibration image. In some embodiments, the output may comprise a matrix of values corresponding to the $B_1^+$ field intensity/strength within the anatomical region captured in the MR calibration image. In some embodiments, the output of the deep neural network may comprise a residual value, which produces a $B_1^+$ field intensity value when combined with another value, such as a pixel/voxel intensity value of the input MR calibration image.

At operation 408, the MRI system adjusts a transmit gain of the RF driver (e.g., RF drive unit 22 in FIG. 1) based on the predicted $B_1^+$ field map. As known in the art, the flip angle of an RF pulse is controlled by varying the magnitude of the $B_1$ field. The magnitude of $B_1$, in turn, is dictated by the output voltage and current of the RF amplifier. By basing the transmit gain selection on a predicted $B_1^+$ field map, more precise control over the flip angles may be enabled during subsequent diagnostic imaging. In particular, with the predicted $B_1^+$ field map covering the region of interest, an average flip angle of a specified transmit RF pulse in the region of interest may be estimated according to, for example, a linear relationship. Thus the transmit gain for the transmit RF coil is adjusted to achieve a desired flip angle in the region of interest. In some embodiments, the Bloch equation is used to simulate the signal behavior in the region of interest based on the predicted $B_1^+$ field map, and the transmit gain can be adjusted based on this simulated signal to improve overall image quality in the region of interest, in terms of signal to noise ratio, signal inhomogeneity, image artifacts etc.

At operation 410, the MRI system acquires a diagnostic MR image of the anatomical region using the transmit gain obtained at 408. The diagnostic MR image may be acquired by any appropriate pulse sequence (e.g., echo spin, gradient echo) and may be of any appropriate contrast (e.g., proton density weighted, T1-weighted, T2-weighted, etc.).

At operation 412, the image processing system may process the MR diagnostic image of the anatomical region obtained at 410 based on the predicted $B_1^+$ field map obtained at 404. The image processing system may perform shading correction on the diagnostic MR image of the anatomical region by adjusting one or more pixel or voxel intensity values based on the predicted $B_1^+$ field map, thereby reducing or mitigating an effect of shading which may be result from $B_1^+$ field inhomogeneities. U.S. patent application Ser. No. 14/584,272 (now issued as U.S. Pat. No. 10,054,658) discloses a method for shading correction with $B_1^+$ field map, which is incorporated herein by reference. Other methods for shading correction with $B_1^+$ field map can be used as well. FIGS. 7 and 8 show examples of shading correction of MR images using predicted $B_1^+$ field maps according to an exemplary embodiment.

At operation 414, the processed MR image obtained at 412 is displayed with a display device (e.g., display device 33 shown in FIG. 1). Method 400 may then end.

In this way, method 400 enables rapid and accurate prediction of a $B_1^+$ field from an MR calibration image, bypassing measurement of the $B_1^+$ field by conventional approaches, which may require substantial amounts of time and computational resources.

Figure 5:
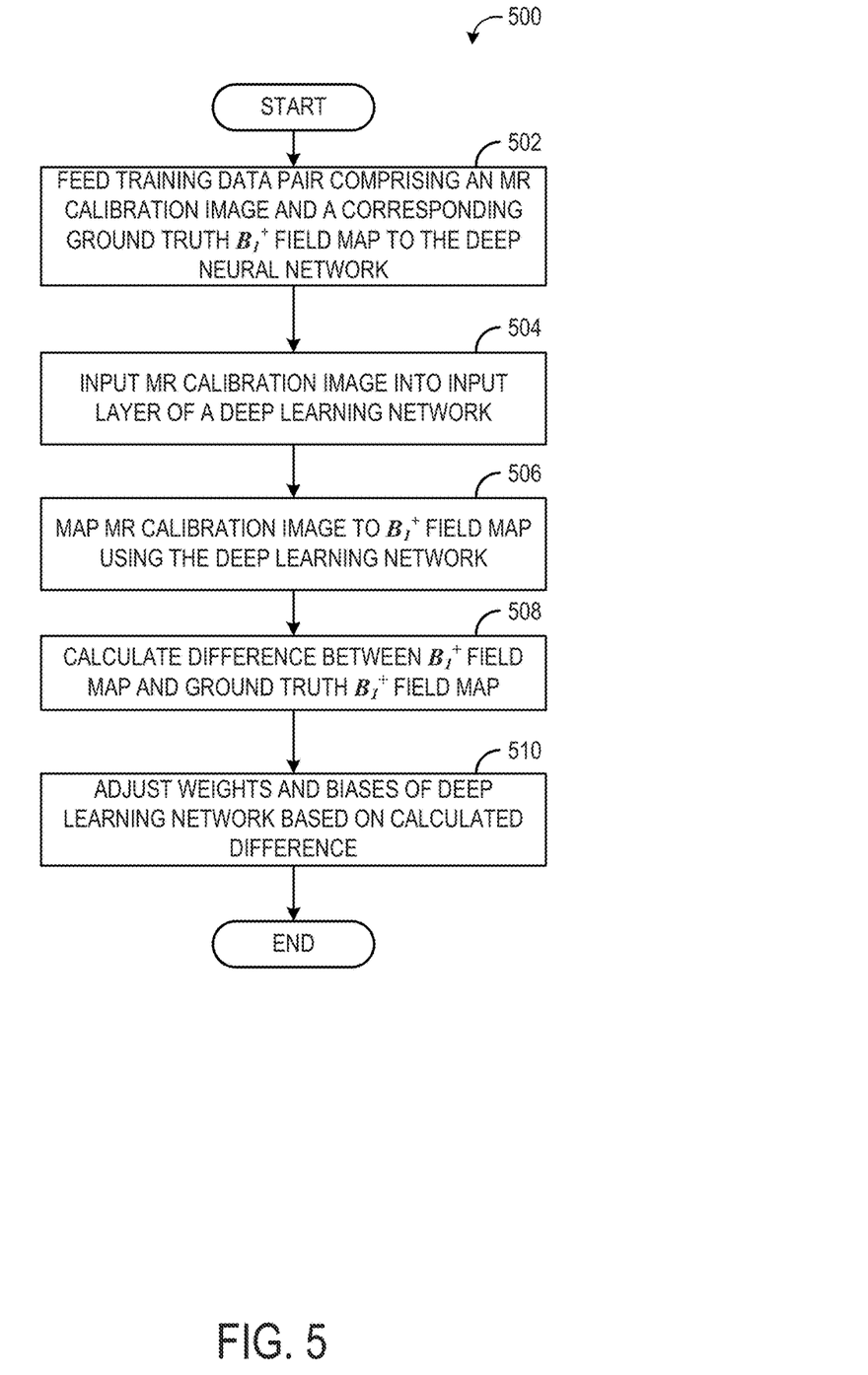
FIG. 5 is a flow chart illustrating a method for training a deep learning network to predict $B_1^+$ maps from MR calibration images, according to an exemplary embodiment.

Referring to FIG. 5, a flow chart of a method 500 for training a deep neural network (such as CNN 300 shown in FIG. 3) is shown, according to an exemplary embodiment. Method 500 may be implemented by the system 10 shown in FIG. 1 or the system 200 shown in FIG. 2. In some embodiments, method 500 may be implemented by training module 212, stored in non-transitory memory 206 of image processing system 31.

Method 500 begins at operation 502, where a training data pair, from a plurality of training data pairs, is fed to a deep neural network, wherein the training data pair comprises a MR calibration image and a corresponding ground truth $B_1^+$ field map. In some embodiments, the training data pair, and the plurality of training data pairs, may be stored in the image processing system, such as in MR image data 214 of image processing system 31. In other embodiments, the training data pair may be acquired via communicative coupling between the image processing system and an external storage device, such as via Internet connection to a remote server. In some embodiments, the ground truth $B_1^+$ field map is obtained by Bloch-Siegert shift based method.

At operation 504, the MR calibration image of the training data pair is input into an input layer of the deep neural network. In some embodiments, the MR calibration image is input into an input layer of a CNN, having an autoencoder-autodecoder type architecture, such as CNN 300 shown in FIG. 3. In some embodiments, each pixel/voxel value of the MR calibration image is input into a distinct node/neuron of the input layer of the deep neural network.

At operation 506, the deep neural network maps the input MR calibration image to a $B_1^+$ field map by propagating the input MR calibration image from the input layer, through one or more hidden layers, until reaching an output layer of the deep neural network. In some embodiments the output of the deep neural network comprises a matrix of values corresponding to the intensity of a $B_1^+$ field at each pixel of the input MR calibration image, or in another words, the output of the deep neural network may comprise a predicted $B_1^+$ field map corresponding to the input MR calibration image.

At operation 508, the difference between the predicted $B_1^+$ field map output by the deep learning network and the ground truth $B_1^+$ field map corresponding to the calibration map is calculated by the image processing system. In some embodiments, a difference between each output value, corresponding to a $B_1^+$ field intensity of the input MR calibration image, and a $B_1^+$ field intensity indicated by the ground truth $B_1^+$ field map is determined. The difference may be calculated according to a loss function, for example:

$$DICE = (S \cap T)/(S \cup T),$$

wherein S is the ground truth $B_1^+$ field map and T is the predicted $B_1^+$ field map.

At operation 510, the weights and biases of the deep neural network are adjusted based on the difference between the predicted $B_1^+$ field map and the ground truth $B_1^+$ field map calculated in operation 508. The difference (or loss), as determined by the loss function, may be back propagated through the neural learning network to update the weights (and biases) of the convolutional layers. In some embodiments, back propagation of the loss may occur according to a gradient descent algorithm, wherein a gradient of the loss function (a first derivative, or approximation of the first derivative) is determined for each weight and bias of the deep neural network. Each weight (and bias) of the deep neural network is then updated by adding the negative of the product of the gradient determined (or approximated) for the weight (or bias) with a predetermined step size. Method 500 may then end. It will be noted that method 500 may be repeated until the weights and biases of the deep neural network converge, or the rate of change of the weights and/or biases of the deep neural network for each iteration of method 500 are under a threshold.

In this way, method 500 enables a deep neural network to be trained to predict a $B_1^+$ field map from an MR calibration image, thereby facilitating rapid determination of a $B_1^+$ field map.

Figure 6:
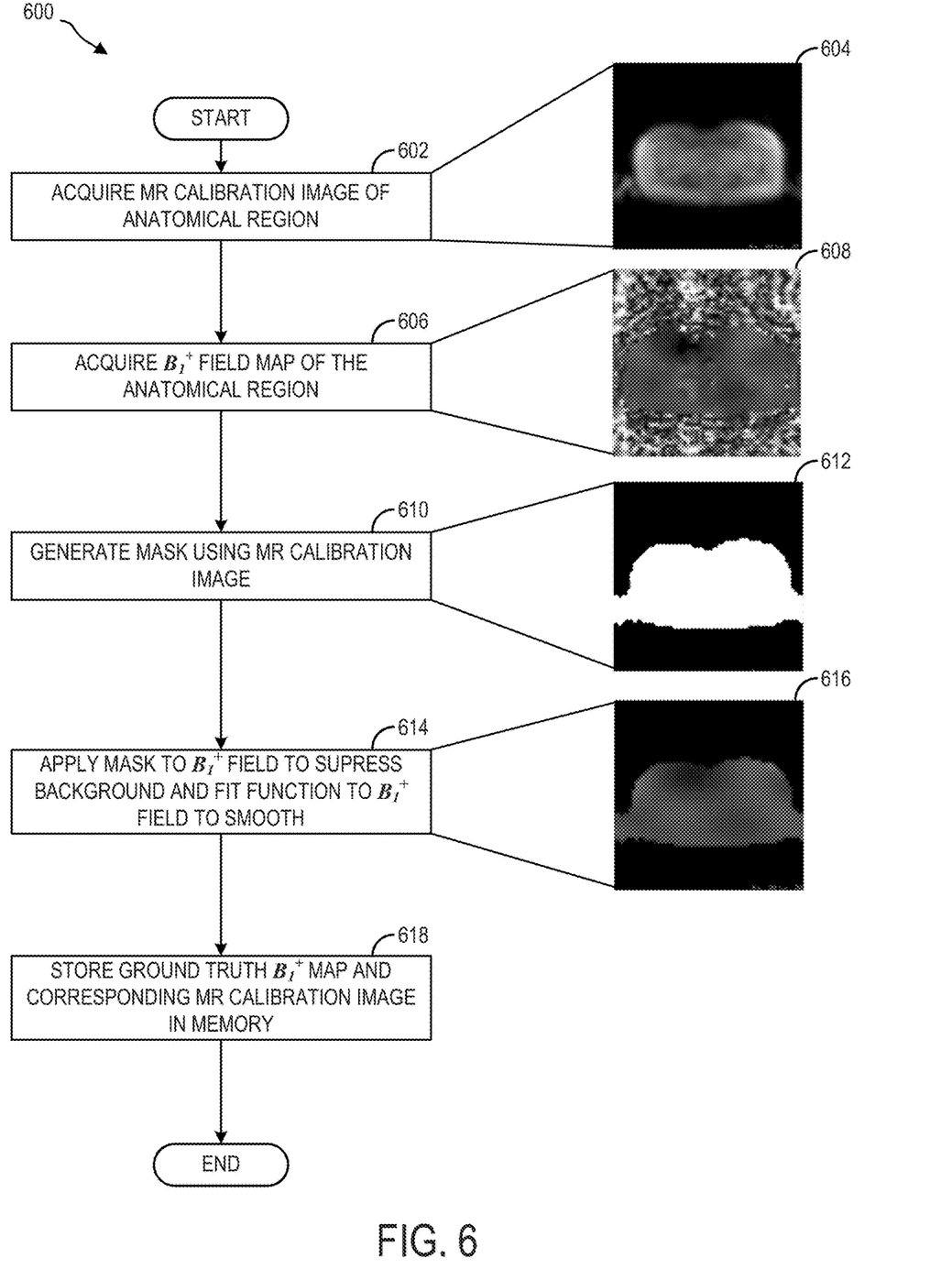
FIG. 6 is a flow chart illustrating a method for collecting and curating data for training a deep learning network to predict $B_1^+$ maps from MR calibration images, according to an exemplary embodiment.

FIG. 6 shows a flow chart of a method 600 for collecting and processing training data for use in training a deep neural network, such as CNN 300 shown in FIG. 3, to map a MR calibration image to a predicted $B_1^+$ field map. Method 600 may be implemented by the system 10 shown in FIG. 1 or the system 200 shown in FIG. 2.

Method 600 begins at operation 602, where the MRI system acquires an MR calibration image of an anatomical region. In some embodiments, the MR calibration image is acquired by a calibration scan using a fast spoiled gradient echo sequence with minimum TR/TE, lower flip angle, high receive bandwidth, low to medium resolution on a large imaging volume.

Example MR calibration image 604, shown to the right of operation 602 in FIG. 6, illustrates one example of an MR calibration image which may be acquired by the MRI system in operation 602. Example MR calibration image 604 shows a proton density correlated intensity map of a cross section of an anatomical region, wherein the anatomical region comprises an abdomen of a patient.

At operation 606, the MRI system acquires a $B_1^+$ field map, of the anatomical region of operation 602. In some embodiments, the $B_1^+$ field map is acquired by using the Bloch-Siegert shift method. The Bloch-Siegert shift method uses two RF pulses. The first is a conventional RF excitation which creates the transverse magnetization. The second is an off-resonance RF pulse which slightly changes the effective frequency of spins that are on resonance. This spin precession frequency shift is proportional to the square of the magnitude of the $B_1^+$ field. Adding gradient image encoding following the off-resonance RF pulse enables acquisition of a spatially resolved $B_1^+$ map. The frequency shift from the Bloch-Siegert effect gives a phase shift in the image that is proportional to $B_1^+$. The phase difference between two acquisitions, with the RF pulse applied at two frequencies symmetrically around the water resonance, is used to reduce off-resonance effects due to amplitude of static field inhomogeneity and chemical shift. Both spin echo or gradient echo sequence with Cartesian, radial or spiral readout can be used to acquire the phase shift information in the volume, and thus the $B_1^+$ map can be derived from the measured phase shift. The Bloch-Siegert shift method was described in detail in "$B_1$ mapping by Bloch-Siegert shift," L. I. Sacolick, et al. *Magn. Reson. Med.*, vol. 63, no. 5, pp. 1315-1322, 2010.

There are variations to the Bloch-Siegert shift method, known in the art, which can also be used to acquire the $B_1^+$ field map, in 606. In some embodiments, other methods known in the art of MRI to measure the $B_1^+$ field, such as double angle, AFI, and phase sensitivity based approaches, can be used as well.

Example $B_1^+$ field map 608, shown to the right of operation 606, illustrates one example of a $B_1^+$ field map acquired by the Bloch-Siegert shift method in operation 606. Example $B_1^+$ field map 608 shows the $B_1^+$ field within the anatomical region, as well as a relatively noisy background surrounding the anatomical region. The noisy background of the $B_1^+$ field map may impede training of the deep neural networks, as the intensity of the noisy background may compete with the $B_1^+$ field of the foreground (that is, of the anatomical region). Deep learning models trained using unprocessed $B_1^+$ field maps, such as that shown by example $B_1^+$ field map 608, may produce inconsistent and/or inaccurate results.

At operation 610, a mask is generated. In some embodiments, the mask is generated using the MR calibration image obtained at 602. In some embodiments, the mask is generated based on the $B_1^+$ field map acquired at 604. In some embodiments, the mask may be generated by first segmenting the MR calibration image into foreground and background pixels/voxels based on, for example, a threshold for intensity values or change of intensity values. The mask comprises a matrix of values, where a pixel identified as background has a corresponding matrix value of zero, while a pixel identified as foreground has a corresponding matrix value of one. In other embodiments, the mask of operation 610 may be generated by any means of image segmentation known in the art of image processing, such as clustering, region growing, etc. Example mask 612 shows a mask corresponding to the anatomical region in operation 602, wherein the white region represents "unmasked" pixels, or values of one, whereas the black region represents "masked" pixels, or values of zero.

At operation 614, the mask generated at operation 610 is applied to the $B_1^+$ field map acquired in operation 606, to produce a background suppressed $B_1^+$ field map. Application of the mask to the $B_1^+$ field map may include multiplying each pixel/voxel in the acquired $B_1^+$ field map by a corresponding matrix value of the mask, thereby masking the intensity of the background pixels of the $B_1^+$ field map, and leaving the intensity of the foreground pixels of the $B_1^+$ field map unchanged. Additionally, at operation 614, the foreground (the unmasked region of the $B_1^+$ field map) may be smoothed by fitting a pre-determined function to the $B_1^+$ field intensity values in the foreground of the $B_1^+$ field map. In some embodiments, a polynomial function is fitted to the $B_1^+$ field intensity values of the foreground of the $B_1^+$ field map, thereby producing a smoother (that is, a non-discontinuous) $B_1^+$ field map. In some embodiments the function used to smooth the $B_1^+$ field map may comprise a harmonic function, or other functions known in the art. In an exemplary embodiment, a $7^{th}$ order polynomial function may be fit to the $B_1^+$ field map using non-linear regression, to produce a smoothed $B_1^+$ field map. The smoothed $B_1^+$ field map may be used as a ground truth $B_1^+$ field map corresponding to the MR calibration image acquired at operation 602.

By suppressing the background noise of an acquired $B_1^+$ field map, and further, by smoothing the $B_1^+$ field map (which may contain discontinuities as a result of foreground noise), a deep neural network may be more effectively trained to map MR calibration images to $B_1^+$ field maps, compared to approaches which utilize un-processed $B_1^+$ field maps for model training, such as that shown by example $B_1^+$ field map 608. Example ground truth $B_1^+$ field map 616, shown to the right of operation 614, illustrates one example of a ground truth $B_1^+$ field map according to the current disclosure. Example ground truth $B_1^+$ field map 616 is generated by applying example mask 612 to example $B_1^+$ field map 608, and then smoothing the foreground of the $B_1^+$ field map by fitting a function to the $B_1^+$ field intensity values in the unmasked region of the $B_1^+$ map.

At operation 618, the MR calibration image obtained at 602 and the ground truth $B_1^+$ field map obtained at 614 are stored as a training data pair. Method 600 may then end.

In this way, method 600 enables generation of training data, which may enable more effective training of a deep neural network to map an MR calibration image to a $B_1^+$ field map.

Turning to FIG. 7, an example of shading correction based on a predicted $B_1^+$ field map is shown. MR image 710 was acquired by a 3D LAVA scan of a cross section of a human abdomen (TR/TE=4.2 ms/1.7 ms, FOV 42 cm×42 cm, with a receive bandwidth of 142.9 KHz acquired in 56 seconds). The $B_1^+$ field inhomogeneity causes a region of high intensity in the upper left hand corner of MR image 710, resulting in poor visualization of the other, darker, regions of the image. A calibration scan with fast spoiled gradient sequence was performed prior to the LAVA scan, producing a calibration image. A $B_1^+$ field map was generated from the calibration image using the method described above in this disclosure. The expected signal variation (image intensity variation) from the transmit $B_1^+$ field was estimated from the predicted $B_1^+$ field map using the Bloch equation on the LAVA sequence. Image 712 was generated after shading correction using the predicted $B_1^+$ field map. The method disclosed in U.S. patent application Ser. No. 14/584,272 (now issued as U.S. Pat. No. 10,054,658) was used herein for shading correction. As can be seen, the region of high intensity in the upper left hand corner of MR image 710 was reversed by adjusting pixel intensity of MR image 710 based on the expected signal variation induced by the $B_1^+$ inhomogeneity, which resulted in a more uniform LAVA image volume shown by shading corrected MR image 712.

Another example of shading correction based on a predicted $B_1^+$ field map is shown in FIG. 8. MR image 810 was acquired by a 3D FSPGR scan of a cross section of human breast (TR/TE=4.9 ms/2.1 ms, FOV 40 cm×40 cm, 46 slices with slice thickness of 3 mm, with a receive bandwidth of 62.5 KHz acquired in 67 seconds). $B_1^+$ field inhomogeneity caused a region of high intensity on the right side of MR image 810, resulting in poor visualization of the other, darker, regions. A calibration scan with fast spoiled gradient sequence was also performed prior to the FSPGR scan, producing a calibration image. A $B_1^+$ field map was generated from the calibration image using the method described above in this disclosure. The expected signal variation (image intensity variation) from the transmit $B_1^+$ field was estimated from the predicted $B_1^+$ field map using the Bloch equation on the FSPGR sequence. Image 812 was generated after shading correction using the predicted $B_1^+$ field map. The method disclosed in U.S. patent application Ser. No. 14/584,272 (now issued as U.S. Pat. No. 10,054,658) was used herein for shading correction. As can be seen, the region of high intensity on the right hand side of MR image 810 was reversed by adjusting pixel intensity of MR image 810 based on the expected signal variation induced by the $B_1^+$ inhomogeneity, which resulted in a more uniform LAVA image volume shown by shading correct MR image 812.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

The invention claimed is:

1. A method for magnetic resonance imaging, the method comprising:
   acquiring a magnetic resonance (MR) calibration image of an anatomical region;
   mapping the MR calibration image to a transmit field map ($B_1^+$ field map) with a trained deep neural network;
   determining a transmitter gain based on the $B_1^+$ field map;
   acquiring a diagnostic MR image of the anatomical region using the transmitter gain; and
   correcting inhomogeneities of a transmit field in the diagnostic MR image with the $B_1^+$ field map, wherein correcting inhomogeneities of the transmit field comprises performing shading correction on the diagnostic MR image of the anatomical region using the $B_1^+$ field map to produce a shading corrected MR image.

2. The method of claim 1, wherein performing shading correction on the diagnostic MR image comprises adjusting an intensity of one or more voxels of the diagnostic MR image based on the $B_1^+$ field map.

3. The method of claim 1, further comprising displaying the shading corrected MR image via a display device.

4. A method comprising:
   training a deep neural network to map MR calibration images to corresponding $B_1^+$ field maps, wherein training the deep neural network comprises:
   mapping an MR calibration image in a training data pair to a predicted $B_1^+$ field map using the deep neural network;
   calculating a difference between the predicted $B_1^+$ field map and a ground truth $B_1^+$ field map of the training data pair; and
   adjusting parameters of the deep neural network via backpropagation based on the difference between the predicted $B_1^+$ field map and the ground truth $B_1^+$ field map to produce a trained deep neural network;
   receiving a particular MR calibration image; and
   mapping the particular MR calibration image to a corresponding $B_1^+$ field map using the trained deep neural network.

5. The method of claim 4, further comprising producing the ground truth $B_1^+$ field map by:
- segmenting a measured $B_1^+$ field map into background and foreground;
- suppressing noise in the background of the measured $B_1^+$ field map; and
- smoothing the foreground of the measured $B_1^+$ field map to produce the ground truth $B_1^+$ field map.

6. The method of claim 5, wherein smoothing the foreground of the $B_1^+$ field map comprises fitting one of a polynomial function and a harmonic function to the foreground of the measured $B_1^+$ field map.

7. The method of claim 5, further comprising obtaining the measured $B_1^+$ field map using one or more of a Bloch-Siegert shift method, a double angle method, DREAM, or AFI.

8. The method of claim 4, wherein the deep neural network comprises an autoencoder-autodecoder neural network.

9. A magnetic resonance imaging (MRI) system comprising:
- a radio frequency (RF) transmit coil configured to generate a transmit field;
- an RF driver configured to drive the RF transmit coil;
- a memory storing a trained deep learning network and instructions; and
- a processor communicably coupled to the RF transmit coil, the RF driver, and the memory and when executing the instructions, configured to:
  - instruct the MRI system to acquire an MR calibration image of an anatomical region;
  - map the MR calibration image to a corresponding $B_1^+$ field map using the trained deep learning network;
  - determine a transmitter gain based on the $B_1^+$ field map;
  - instruct the MRI system to acquire a diagnostic MR image by driving the RF transmit coil via the RF driver according to the transmitter gain; and
  - correct inhomogeneities of the transmit field in the diagnostic MR image with the $B_1^+$ field map, wherein correcting inhomogeneities of the transmit field comprises performing shading correction on the diagnostic MR image of the anatomical region using the $B_1^+$ field map to produce a shading corrected MR image.

10. The MRI system of claim 9, the system further comprising a display device, and wherein the processor is further configured to execute the instructions to display the shading corrected MR image via the display device.

11. The MRI system of claim 9, wherein the memory further stores instructions for training the deep learning network.

12. The MRI system of claim 11, wherein the processor, when executing the instructions for training the deep learning network, is configured to:
- feed a plurality of training data pairs to the deep learning network, each training data pair includes an MR calibration image and a corresponding ground truth $B_1^+$ field map;
- map the MR calibration image in a training data pair to a predicted $B_1^+$ field map using the deep learning network;
- calculate a difference between the predicted $B_1^+$ field map and the corresponding ground truth $B_1^+$ field map; and
- adjust parameters of the deep learning network via backpropagation based on the difference between the predicted $B_1^+$ field map and the ground truth $B_1^+$ field map.

13. The MRI system of claim 12, wherein the processor, when executing the instructions for training the deep learning network, is further configured to:
- segment a measured $B_1^+$ field map into background and foreground;
- suppress noise in the background of the measured $B_1^+$ field map; and
- smooth the foreground of the measured $B_1^+$ field map to produce the ground truth $B_1^+$ field map.

14. The MRI system of claim 9, wherein the trained deep learning network is a convolutional neural network (CNN).

* * * * *